United States Patent [19]

McMannis

[11] 4,107,600
[45] Aug. 15, 1978

[54] ADAPTIVE FREQUENCY TO DIGITAL CONVERTER SYSTEM

[75] Inventor: William Thomas McMannis, Springdale, Ohio

[73] Assignee: General Electric Company, Cincinnati, Ohio

[21] Appl. No.: 750,066

[22] Filed: Dec. 13, 1976

[51] Int. Cl.² ............................................. G01R 23/02
[52] U.S. Cl. ............................... 324/78 R; 324/78 D; 324/186; 324/187
[58] Field of Search ....................... 128/2.06 F, 2.05 T; 235/92 T; 324/186, 187, 77 R, 77 B, 78 D, 78 Z, 79 D; 340/3 R; 328/129

[56] References Cited

U.S. PATENT DOCUMENTS

| 3,731,194 | 5/1973 | Favin | 324/186 |
|---|---|---|---|
| 3,787,802 | 1/1974 | Brahman | 324/187 |
| 4,020,418 | 4/1977 | Burrage | 324/78 D |
| 4,025,868 | 5/1977 | Miki et al. | 324/78 D |

*Primary Examiner*—M. Tokar
*Attorney, Agent, or Firm*—James W. Johnson, Jr.; Derek P. Lawrence

[57] ABSTRACT

In a system for converting information in the form of an AC frequency to digital data, a binary number having a magnitude proportional to the frequency is derived by generating a stream of pulses at a known clock rate and counting the number of pulses occurring during a specified period of the AC frequency. A high degree of accuracy is achieved by varying the clock rate as a function of the frequency of the AC signal such that an optimum numeric count is reached. The counter counts the duration of the first half period of the first cycle of the AC signal at a first fixed clock rate. The most significant bits of the generated count are input as a scaling factor to a binary rate multiplier which increases the clock rate in proportion to the magnitude of the scaling factor. The duration of the first half period of the succeeding cycle of the AC signal is then counted at the new rate. The scaling factor and second generated count may be input to a microprocessor which computes the frequency of the AC signal according to stored formulae. An overflow latch may be provided to store counter overflow and provide a signal to the microprocessor that the frequency of the input signal is below a minimum usable range.

20 Claims, 10 Drawing Figures

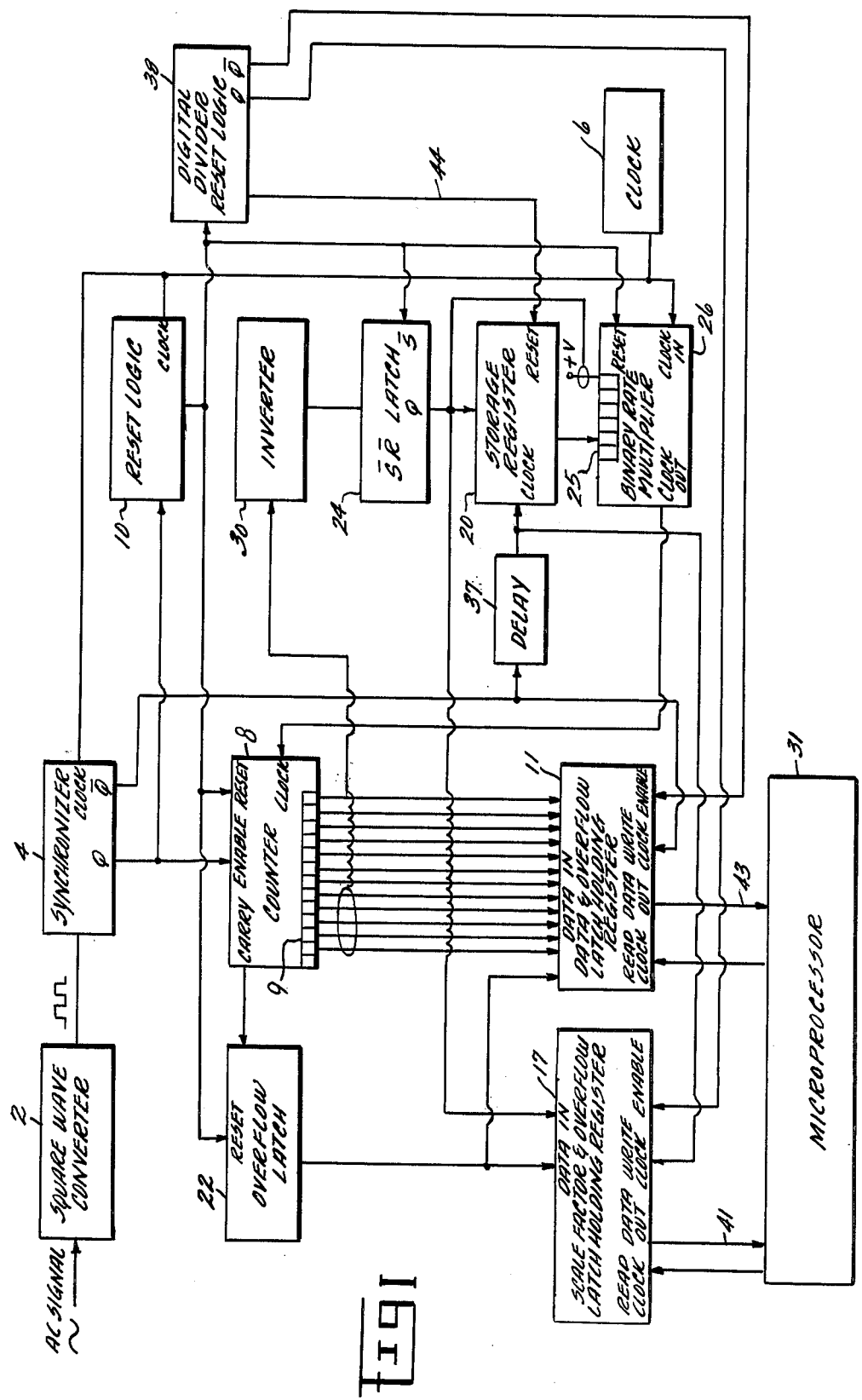

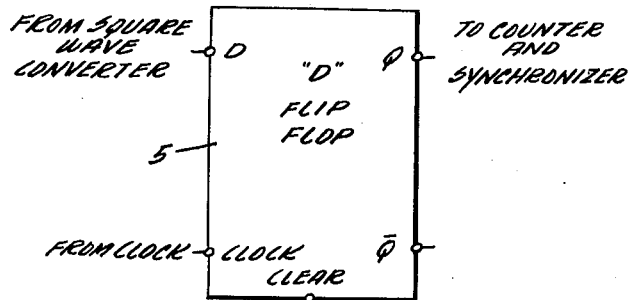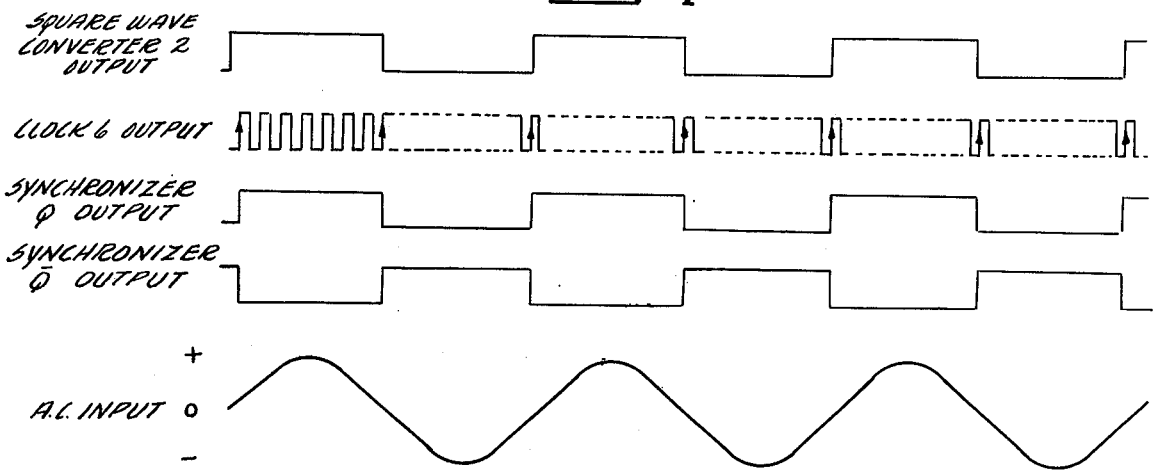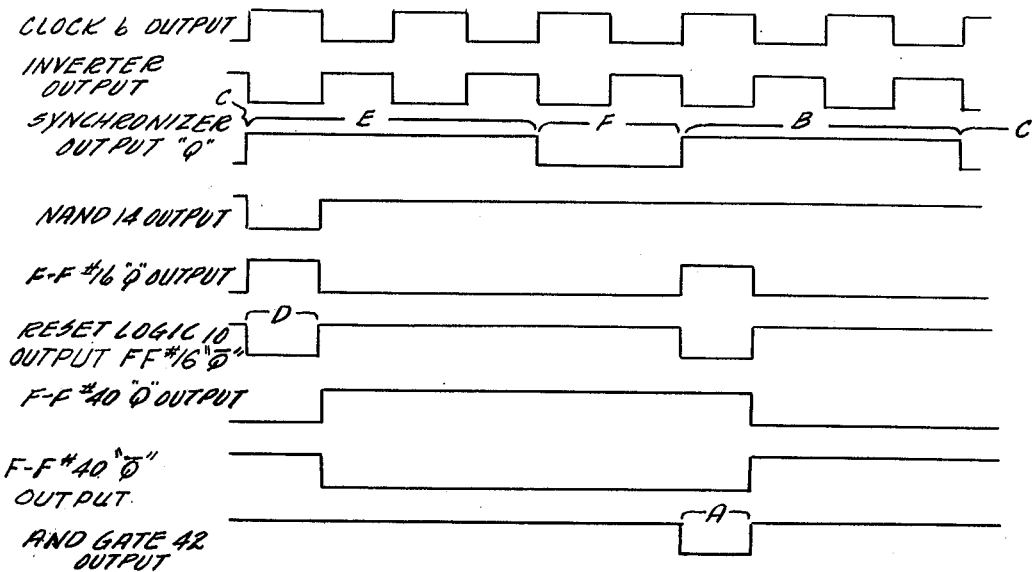

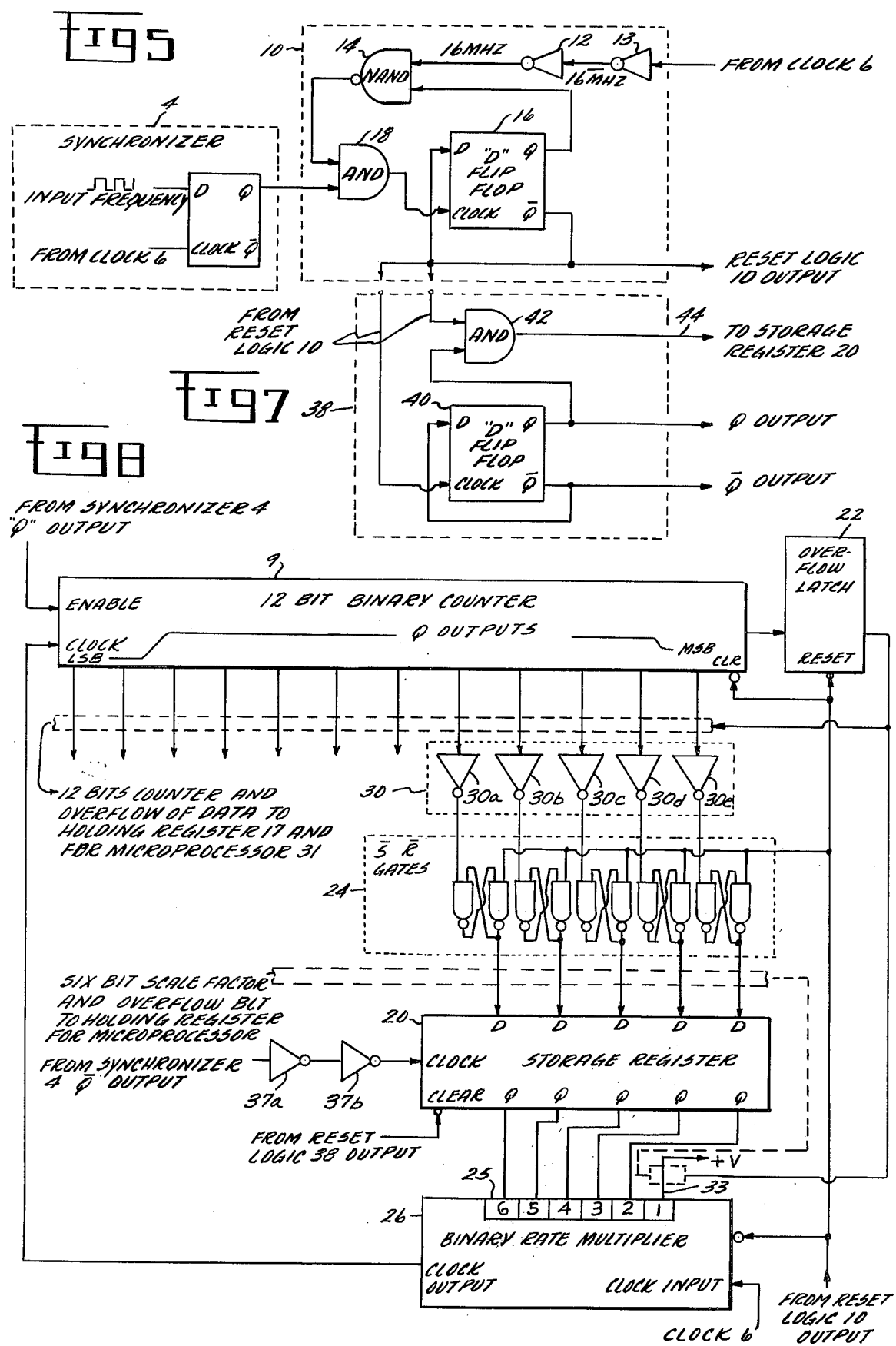

Fig. 9

| INPUTS | | OUTPUTS |
|---|---|---|
| $\overline{S}$ | $\overline{R}$ | Q |
| H | H | $Q_0$ |
| L | H | H |
| H | L | L |
| L | L | H* |

$Q_0$ = THE LEVEL OF Q BEFORE INDICATED CONDITION

H* THIS OUTPUT LEVEL IS PSEUDO STABLE: THAT IS, IT MAY NOT PERSIST WHEN THE $\overline{S}$ AND $\overline{R}$ RETURN TO THEIR INACTIVE HIGH LEVEL

Fig. 10

| 1ST HALF PERIOD COUNT | 2ND HALF PERIOD COUNT C | FREQUENCY Hz Fi | RESOLUTION % | SCALE FACTOR N |
|---|---|---|---|---|
| 127 | 2000 | 3937 | .0488 | 63 |
| 127 | 4000 | 1968.5 | .0244 | 63 |
| 127 | 8001 | 984.25 | .0122 | 63 |
| 128 | 3968 | 976.6 | .0252 | 31 |
| 255 | 7905 | 490.2 | .01265 | 31 |
| 256 | 3840 | 488.3 | .02604 | 15 |
| 511 | 7665 | 244.6 | .01305 | 15 |
| 512 | 3584 | 244.1 | .0279 | 7 |
| 1023 | 7161 | 122.2 | .014 | 7 |
| 1024 | 3072 | 122.1 | .0326 | 3 |
| 2047 | 6141 | 61.1 | .016 | 3 |
| 2048 | 2048 | 61.0 | .0488 | 1 |
| 4095 | 4095 | 30.5 | .0244 | 1 |

ADAPTIVE FREQUENCY TO DIGITAL CONVERTER SYSTEM

BACKGROUND OF THE INVENTION

The present invention relates to a system for converting information in the form of an AC frequency to corresponding digital data suitable for processing by a digital computer. Such systems enjoy a wide variety of applications and are particularly useful for generating digital signals representative of the angular velocity of a rotating mass. Such digital signals are widely used in various control and measurement systems such as in digital controls for aircraft engines.

Prior art systems have used various pulse counting schemes which count at a fixed rate throughout the duration of the period or half period of the AC signal. Such techniques have been found to be inaccurate for applications in which the information of interest is contained at higher frequencies since these systems produce a digital number which has least resolution at such higher frequencies. Other prior art systems have used converters to convert the AC frequency to a DC analog voltage and thereafter an analog to digital converter to convert the analog signal to a digital voltage. These systems, however, also produce errors in the digital signal due to the drift of the various analog components used.

OBJECT OF THE INVENTION

Accordingly, it is a primary object of the present invention to provide a system for converting an AC signal into a binary number whose magnitude is proportional to the frequency of the AC signal which has a high resolution at all frequencies of interest.

it is a further object of the present invention to provide a system for converting an AC signal into a binary number which is not subject to error due to analog drift of the components used therein.

SUMMARY OF THE INVENTION

These and other objects are achieved in the preferred embodiment of this invention in which a system for converting an AC signal into a binary number having a magnitude proportional to the frequency of the AC signal is provided with a clock for generating pulses at a known rate, a counter for counting the number of pulses occurring during a specified period of the AC signal and means for varying the rate at which clock pulses are generated in response to the frequency of the AC signal. In the disclosed embodiment the number of pulses occurring during the first half period of the AC signal are counted. The most significant bits of the counter are input as a scaling factor to a binary rate multiplier which increases the clock rate in proportion to the magnitude of the scaling factor. The duration of the first half period of the succeeding cycle of the AC signal is then counted at the new rate. The scaling factor and second generated count may be input to a mircoprocessor which computes the frequency of the AC signal according to stored formulae.

BRIEF DESCRIPTION OF THE DRAWINGS

FIG. 1 is a schematic diagram in block format illustrating the frequency to digital conversion system of the invention.

FIG. 2 is a diagram illustrating a flip flop used in the frequency to digital conversion system of this invention.

FIG. 3 is a truth table for the flip flop of FIG. 2.

FIG. 4 is a timing chart for the frequency to digital conversion system of this invention.

FIG. 5 is a schematic diagram of reset logic used in the frequency to digital conversion system of this invention.

FIG. 6 is a timing chart for the frequency to digital conversion system of this invention.

FIG. 7 is a schematic diagram of scale factor reset logic used in the frequency to digital conversion system of this invention.

FIG. 8 is a schematic diagram of a portion of the frequency to digital conversion system of FIG. 1.

FIG. 9 is a truth table for an $\overline{SR}$ latch used in the frequency to digital conversion system of this invention.

FIG. 10 is a table illustrating the principles of this invention.

DESCRIPTION OF THE PREFERRED EMBODIMENT

Referring to FIG. 1, therein is shown a schematic diagram of the frequency to digital conversion system of this invention. Information in the form of an AC signal is input to a square wave converter 2 well-known in the art which outputs a square wave of substantially identical frequency as the input AC signal. The square wave thereafter is input to a synchronizer 4 which synchronizes the square wave with the input from a digital clock 6 having a clock frequency significantly greater than the frequency of the input square wave, preferably in the order of 100 to 1 or greater. Such synchronizers are well-known in the art and may comprise a "D" type flip flop 5 as shown in FIG. 2, having the truth table shown in FIG. 3, and having the output from the square wave converter 2 connected to the "D" input, the signal from the clock 6 connected to the "clock" input and the "clear" input permanently biased high. Connected in this manner, the flip flop 5 will cause the output generated at the "Q" terminal and the inverse thereof at the "$\overline{Q}$" terminal to transition from low "L" to high "H" or from high to low in response to changes in the input square wave only when the clock transitions from low to high. Clock transitions from low to high are represented in the truth table of FIG. 3 as ↑. From examination of the truth table of FIG. 3, it can be seen that whenever the output from square wave converter 2 goes high, the "Q" output of the flip flop 5 goes high on the very next transition from low to high of the signal from the clock 6 and similarly, whenever the output from converter 2 goes low, the "Q" output of flip flop 5 goes low on the very next low to high transition of the output from clock 6. This produces a square wave of the same frequency as the converter output but which may lag the converter square wave by as much as one clock period. The synchronizer 4 thus insures that the square wave outputs at the Q and $\overline{Q}$ terminals of flip flop 5 are of identical frequency as the square wave input on the D terminal of flip flop 5 and that each is synchronized with the clock input to thereby insure accurate counting of the clock pulses. A timing diagram illustrating the relationship of the inputs and outputs of the synchronizer 4 is shown in FIG. 4. The delay between the inputs and outputs of synchronizer 4 have been exaggerated in FIG. 4 to illustrate the synchronization process.

The synchronized square wave output from the Q terminal of the D flip flop 5 is input to a digital counter 8 and to reset logic 10. Reset logic 10 is designed to output a fixed length reset pulse at the start of the first half period of each cycle of the input square wave as shown in the timing diagram of FIG. 6. Referring to FIG. 5, therein is shown a preferred embodiment for the reset logic 10. Reset logic 10 receives the output from the digital clock 6 and thereafter uses two series-connected inverters 12 and 13 to shift the clock in phase a small amount; for example, 10 nanoseconds and thereafter inputs that signal to one input terminal of a NAND gate 14. The other input of the NAND gate 14 is connected to the "Q" output terminal of a "D" flip flop 16 of the type having the characteristics set forth in the truth table of FIG. 3. The output from the NAND gate 14 is connected to one input terminal of an AND gate 18 which has its other input terminal connected to the Q output terminal of the synchronizer 4. The output terminal of AND gate 18 is connected to the "clock" input terminal of flip flop 16. Flip flop 16 has its clear line permanently biased high. The reset signal is taken from the $\overline{Q}$ output of flip flop 16. The $\overline{Q}$ output of flip flop 16 is also connected to the "D" input terminal of flip flop 16. This arrangement causes flip flop 16 to output on the $\overline{Q}$ terminal thereof a short reset signal of fixed duration (for example 31 nanoseconds when the clock 6 has a frequency of 16 megahertz) at the beginning of the first half period of each cycle of the square wave input from the synchronizer 4. The interrelationship between the inputs and outputs of reset logic 10 are shown in the timing diagram of FIG. 6. As can be seen from examination of this timing diagram, as long as the Q output of flip flop of 16 is low the output of NAND gate 14 is high; regardless of whether the delayed input from clock 6 is high or low. The high output from NAND gate 14 enables one of the two inputs of AND gate 18 so that when the other input of AND gate of 18 is changed from low to high in response to the corresponding change in the Q output of synchronizer 4, this low to high transition will carry through to the output of AND gate 18 and be input to the "clock" terminal of flip flop 16. Since the D input of flip flop 16 is connected to the $\overline{Q}$ output of flip flop 16, the D input of flip flop 16 will always be set at the inverse of the Q output of flip flop 16. Thus, if the Q output of flip flop 16 is low when the low to high transition is received on the "clock" input line of flip flop 16, the D input of flip flop 16 will be set at high. This transition will thereby cause the Q output of flip flop 16 to go high and the $\overline{Q}$ output and D input of flip flop 16 to go low. The high output of the Q terminal of flip flop 16 enables NAND gate 14 which on the next high to low transitions of the delayed signal input from clock 6 causes a low to high transition at the output of NAND gate 14. The low to high transition output from NAND gate 14 is input to AND gate 18 and passes therethrough since the AND gate 18 is still enabled by the high signal received from the Q output of synchronizer 4. This in turn causes a second transition from low to high on the clock input terminal of flip flop 16 causing the Q output thereof to transition from high to low and the $\overline{Q}$ output and D input to transition from low to high. This returns the reset logic circuitry to repeat the above described process upon the next low to high transition of the Q output from synchronizer 4. As can be seen from the timing diagram of FIG. 6, a reset pulse on the $\overline{Q}$ terminal of flip flop 16 is produced equal to one-half the clock period. The delaying inverters 12 and 13 are used to stretch the reset pulse an additional length of time in proportion to the propagation delays of the inverters 12 and 13.

In order to provide a single reset pulse for every two reset pulses output from reset logic 10 digital divider reset logic 38 is provided. Digital divider reset logic 38, as best seen in FIG. 7, comprises a D flip flop 40 having the truth table of FIG. 3 and having its $\overline{Q}$ output connected to its D input, its Q output connected to one input terminal of an AND gate 42 and its clock terminal connected to the $\overline{Q}$ output of flip flop 16 of reset logic 10. The other input of AND gate 42 is also connected to the $\overline{Q}$ terminal of flip flop 16. Connected in this manner, the $\overline{Q}$ and Q outputs of flip flop 40 will toggle each time the signal on the "clock" line of flip flop 40 transitions from low to high. Since the clock line of flip flop 40 is connected to the $\overline{Q}$ terminal of flip flop 16 the signals on the Q and $\overline{Q}$ terminal will transition every other time that the signal on the $\overline{Q}$ line of flip flop 16 transitions from low to high. The Q output of flip flop 40 is used to enable AND gate 42 in order to pass the reset signal from logic 10 to an output line 44 during the periods when the signal on the Q terminal of flip flop 40 is high. Thus, whenever the Q output terminal of flip flop 40 is high, which occurs every other time that a reset pulse is generated by reset logic 10, AND gate 42 will be enabled to pass the reset logic pulse to line 44. The relationships of the inputs and outputs of reset logic 38 is best seen in the timing diagram of FIG. 6. The $\overline{Q}$ output terminal of flip flop 40 is connected to the enable line of a holding register 11 and the Q output terminal of flip flop 40 is connected to the enable line of a holding register 17 for purposes which will be more fully described below.

The digital counter 8 is of the type well-known in the art which stores a cumulative count in an internal register 9 of the number of pulses received on the clock input line during the period the signal on the enable line is maintained high. For this application the enable line is connected to the Q output of synchronizer 4 and the clock input terminal is connected to the clock output line of a binary rate multiplier 26. The cumulative count in register 9 is accessed by a microprocessor 31 via the holding register 11. An indication of overflow of the counter internal register 9 is provided by connecting the carry bit of the register 9 to an overflow latch 22. Overflow latch 22 and counter register 9 are reset to zero in response to reset pulses from reset logic 10. The overflow latch 22 is also accessed by the microprocessor 31 through the holding register 11.

Holding register 11 is of the type well-known in the art which during periods that the signal on its "enable" terminal remains high, permits the contents of an internal storage register to be read out on its data out line in response to clock signals received on its read clock terminal and permits data on its data in line to be stored in its internal register in response to clock signals received on its write clock terminal. For this application, storage register 11 has its data lines connected to the counter register 9 and overflow latch 22; its data out line connected to the microprocessor 31, its enable terminal connected to the $\overline{Q}$ output of digital divider reset logic 38, its read clock terminal connected to the microprocessor 31, and its write clock terminal connected to the $\overline{Q}$ output of synchronizer 4 for purposes which will be more fully described below.

The most significant bits of the cumulative count in register 9 are transmitted to a storage register 20 via a series connected inverter circuit 30 and a $\overline{SR}$ latch circuit 24. These bits are stored in reverse order in the storage register 20 such that the least significant bit positions of the storage register 20 correspond to the most significant bit positions of the counter register 9 as best seen in FIG. 8.

Referring to FIG. 8, therein is shown the details of inverter circuit 30 and $\overline{SR}$ latch circuit 24. Inverter circuit 30 comprises a plurality of inverters 30a, 30b, 30c, 30d and 30e one for each bit position of the counter register 9 which will be input to the storage register 20. By way of example the five most significant bit positions are shown as being input into storage register 20. The output of each inverter is connected to the R input terminal of a respective $\overline{SR}$ gate 24 having its other input terminal connected to the output of reset logic 10 and its output connected to respective bit positions of storage register 20. $\overline{SR}$ gates 24 are of the type well-known in the art which change output states from low to high and vice versa in response to corresponding changes in signals received on its $\overline{S}$ and $\overline{R}$ input terminals in the prescribed sequence shown in the truth table of FIG. 9. Connected in the aforementioned manner, the $\overline{SR}$ gates serve to remember when the respective output from the counter register 9 changes states and to gate this change to the input of storage register 20 on signal from reset logic 10.

Storage register 20 may comprise a plurality of "D" flip flops as shown in FIG. 2 having the truth table of FIG. 3. One D flip flop is used for each bit position of storage register 20. Each flip flip in register 20 has its D input connected to the output of a respective $\overline{SR}$ gate 24, its $\overline{Q}$ output connected to the scale factor register 25 of the binary rate multiplier 26, its clear terminal connected to the line 44 of reset logic 38 and its clock terminal connected to the $\overline{Q}$ output of synchronizer 4. Connected in this manner, storage register 20 will gate changes in the state of its input D terminals to its output Q terminal and to scale factor register 25 each time the $\overline{Q}$ output of synchronizer 4 transitions from low to high. This occurs at the beginning of every cycle of the input AC signal. The outputs of storage register 20 will reset to zero at the beginning of every other cycle of the AC input signal in response to reset signals from digital divider logic 38. A suitable time delay 37 comprising a pair of inverters 37a and 37b may be provided between the output of synchronizer 4 and the clock input of storage register 20 to insure that changes in the D inputs to storage register 20 from $\overline{SR}$ gates 24 have taken place before they are gated to the scale factor register 25 by outputs from synchronizer 4.

In accordance with another aspect of this invention, the scale factor and output of overflow latch 22 may be input to the microprocessor 31 through a suitable holding register 17. Holding register 17 is functionally equivalent to the holding register 11 and has its data in lines connected to the output of $\overline{SR}$ circuit 24, and the output of overflow latch 22, its write clock terminal connected to the output of delay 37, its enable terminal connected to the Q output of reset logic 38 and its read clock terminal and data out lines connected to microprocessor 31, to permit access of the contents of holding register 17 by microprocessor 31 as will be more fully described below.

The binary rate multiplier 26 is of the type well-known in the art which divides the frequency of the signal received at its "clock in" line by the binary number stored in its internal scale factor register 25 and thereafter outputs this divided signal on the "clock out" line. The frequency of the signal output on the "clock out" line may be represented by the formula:

$$F_o = (N/K) \times F_c$$

where:

$F_o$ is the frequency of the signal on the "clock out" line of the binary rate multiplier N is the magnitude of the scale factor $F_c$ is the frequency of the signal on the "clock in" line of the binary rate multiplier $K_1$ is a constant representing the scale factor size and is determined by the formula $K_1 = 2^R$ where R is the number of bit positions contained in the scale factor register.

By way of an example, let us assume that clock 6 outputs a stream of pulses at 16 MHz and that scale factor register 25 has six bit positions with the least significant bit position permanently biased high and the remaining 5 bit positions set by the storage register 20. The sequence of operation begins with the reset signal on line 44 (labeled "A" in the timing diagram of FIG. 6). This causes the five most significant bits 2 through 6 of the scale factor register 25 to go to zero. This results in the scale factor register 25 being set to a value of "000001." The frequency output on the "clock output" line $F_o$ will therefore be equal to $\frac{1}{64} \times 16$ MHz = 0.25 MHz. The binary rate multiplier 26, binary counter 8 and overflow latch 22 are also reset at the time period A as a result of a reset signal from reset logic 10.

Throughout the duration of this first half period (labeled "B" in FIG. 6) the output of the synchronizer 4 will remain high thereby enabling the counter 8 to count the pulses received on the clock input line at this 0.25 MHz rate. At the end of the first half period the signal on the enable line of the counter will return to low and remain there for the succeeding half period (labeled "C" in FIG. 6) thereby inhibiting further counting. The most significant bits of the count generated during this first half period will be gated in reverse order to the scale factor register 25 during the second half period by signals from the $\overline{Q}$ output of synchronizer 4 through delay 37 to storage register 20. This causes the binary rate multiplier 26 to generate pulses on the "clock out" line at a new rate determined by the magnitude of the binary number stored in the scale factor register 25. By way of example, if counter 8 contains a 12 bit register and a count of 127 is accumulated during the first half period of the first cycle (corresponding to an input signal of relatively short duration and high frequency) the five most significant bit positions will remain at "zero." This in turn will cause the scale factor to be set at "111111" resulting in a maximum frequency on the clock output line of the binary rate multiplier 26 during the first half period of the second cycle of 63/64 × 16 MHz = 15.75 MHz.

Nothing occurs during time interval "C" of FIG. 6, i.e., the second half period of the first cycle of the AC signal. At the time interval "D" of FIG. 6, the binary counter 8, overflow latch 22, $\overline{SR}$ latch 24 and binary rate multiplier 25, are all reset by the reset signal from reset logic 10. During time interval "E", of FIG. 6, the binary counter 8 is again enabled by the Q output of synchronizer 4 and thereby allow counting the newly scaled clock output from the binary rate multiplier 26.

For relatively high frequencies the counter 8 will count during the second cycle at a maximum rate of 15.75 MHz. This count rate will be decreased as frequency is decreased to a minimum rate of 1/64 × 16 = 0.25 MHz. Thus, by setting the frequency of the clock 6 at a rate which will provide a high resolution at the highest frequency of interest the conversion system of this invention will adjust the clock frequency to provide an equally high resolution at other lesser frequencies of interest. FIG. 10 shows a table of generated counts, clock rates and resultant resolutions for the cited illustrated example. As can be seen from this table the circuit maintains a relatively high resolution throughout the entire frequency range of interest. Thus, the frequency to digital conversion system disclosed herein permits the resolution of a counter to be adapted to the frequency of the input signal.

In accordance with another aspect of this invention the scale factor overflow latch outputs are accessed by the microprocessor 31 through a suitable holding register 17 similar to the holding register 11. Holding register 17 is enabled by the Q output from reset logic 38 to permit the scale factor and the overflow latch bit to be read in during the time period "B" of FIG. 6 by delayed signals from the $\overline{Q}$ output of synchronizer 4 and to permit access to this data by the microprocessor 31 during this same period. Similarly, holding register 11 is enabled by the $\overline{Q}$ output from reset logic 38 to permit the contents of counter register 9 and overflow latch 22 to be read in during the period "F" of FIG. 6 by signals from the $\overline{Q}$ output of synchronizer 4 and to permit access to this data by the microprocessor 31 during this same period in order to calculate the frequency of the incoming AC signal as described below. Interrogation of the holding registers 11 and 17 by the microprocessor 31 is preferably synchronized with the falling edge of the signals from clock 6 by circuitry (not shown) to insure valid scale factor, overflow latch, and counter data since clocking into the holding registers 11 and 17 is on the rising edge of the clock signal input from clock 6. It is also possible to replace holding registers 11 and 17 by using a microprocessor 31 having suitable input-/output logic and a direct memory access system.

The microprocessor uses the output from the overflow latch register to inhibit further processing when an overflow count condition is sensed during the first half period of the first cycle. This condition indicates that the input AC signal is below a minimum useful range (corresponding to frequencies below 30.5 Hz in the cited example as illustrated in FIG. 10). The computer may then step to the next input for processing. The overflow latch output is also input to the holding register 11 to provide an extra data bit to the microprocessor 31 for computing the frequency of the AC signal. The microprocessor 31 uses the information from holding registers 11 and 17 to compute the frequency of the input AC signal according to stored formula. This formula may be represented by the equation:

$$F_1 = K_2 \times N/C$$

where:
$F_1$ is the frequency of the input square wave
$K_2$ is a constant depending upon the selected frequency of the clock, and the sizes of the scale factor register and the counter register. (For the above cited illustrated example $K_2$ is equal to 125,000).
C is the count of the counter during the second half cycle.

N is the magnitude of the scale factor. Resultant frequencies from the above cited example are shown in FIG. 10.

Various changes could be made in the structures shown in FIGS. 1 through 10 without departing from the scope of the invention. The size of the counter 8, scale factor register 25 and the frequency of the digital clock 6 may be modified to accommodate the range of expected input signals. Further, with minor modifications, the system disclosed herein may be adapted to recount at a rescaled clock rate during the second half period of the first cycle rather than the first half period of the second cycle as disclosed herein. Such a system has the advantage of increased speed over the disclosed embodiment.

Therefore, having described preferred embodiments of the invention, though not exhaustive of all possible equivalents, what is desired to be secured by Letters Patent of the United States is claimed below.

What is claimed is:

1. A method of converting a plurality of AC signals within a frequency range of interest to respective digital signals each having a binary value proportional to the frequency of a corresponding AC signal comprising:
    (a) selecting a first AC signal
    (b) generating a stream of pulses at a first clock frequency
    (c) counting the number of pulses generated during a specified period of the selected AC signal and storing the count in a register of predetermined size
    (d) generating a stream of pulses at a new clock frequency determined by using the generated count to compute a value for increasing the first clock frequency by an amount calculated to generate a cumulative total of clock pulse during said specified period sufficient to use most bit positions of said register
    (e) counting the number of pulses generated at the new clock frequency during a subsequent period of equal duration to said specified period, and
    (f) selecting a new AC signal and repeating steps (a) through (e) each time a new frequency is selected whereby a high resolution of conversion is achieved throughout the frequency range of interest.

2. The method of claim 1 wherein:
   the pulses are supplied by a binary rate multiplier, and
   the most significant bits of the first generated count are used to derive a scaling factor to increase the output clock frequency of the binary rate multiplier.

3. The method of claim 2 wherein the least significant bit of the scaling factor is permanently biased high and the remaining bits are derived from the most significant bits of the first generated count.

4. The method of claim 3 wherein the remaining bits of the scaling factor are set as the reciprocal of the most significant bits of the first generated count in reverse order such that the most significant bit positions of the first generated count corresponds to the least significant bit positions of the remaining bits.

5. The method of claim 1 further comprising the step of:
   using the first and second generated counts and the first and second clock frequencies to compute the frequency of the AC signal.

6. The method of claim 1 further comprising the step of:

terminating step (c) when said first generated count exceeds a predetermined value and thereafter repeating step (f).

7. A system for converting an AC signal to a digital signal having a binary value proportional to the frequency of the AC signal comprising:
   means for generating a stream of pulses at a first clock frequency,
   means for counting the total number of pulses generated during a specified period of the AC signal and storing the total in a register of predetermined size
   means responsive to the total for generating a stream of pulses at a new clock frequency calculated to generate a new cumulative total of clock pulses during said specified period sufficient to use most bit positions of said register, and
   means for counting the total number of pulses generated at the new clock frequency during a subsequent period of equal duration to said specified period, whereby a high resolution of conversion may be achieved throughout the processing of a plurality of AC signals lying within a particular frequency range of interest.

8. The conversion system of claim 7 further comprising:
   means for converting the AC signal into a square wave having a frequency substantially equal to the frequency of the AC signal,
   means for synchronizing the square wave with generated clock pulses,
   reset logic means for generating a reset pulse at the beginning of said specified period and at the beginning of said subsequent period, and
   wherein the synchronized clock pulses, square wave and reset pulse are input to the counting means.

9. The conversion system of claim 8 wherein the counting means comprises:
   a digital counter having enable, reset and clock input terminals and having an internal register for maintaining an accumulative count of pulses received on the clock input terminal during the periods the signal received on the enabled terminal is "high" and the count of which is reset to zero in response to a pulse received on the reset terminal, and
   wherein the square wave is input to the enable terminal, the clock pulses are input to the clock terminal and reset pulses generated by the reset means are input to the reset terminal.

10. The conversion system of claim 9 further comprising: storage register means for storing in inverse order the binary value of the most significant bit positions of said internal register.

11. The conversion system of claim 10 wherein said clock frequency increasing means comprises a binary rate multiplier having a multi-bit scale factor register, a clock input terminal connected to said pulse generating means, and a clock output terminal for outputting pulses to the clock input terminal of said counter and wherein the frequency of pulses output from the clock output terminal is determined by the frequency of the pulses input to the clock input terminal and the binary value of the contents of the scale factor register.

12. The conversion system of claim 11 wherein the frequency of pulses output from the binary rate multiplier is represented by the formula:

$$F_o = [S/R \times F_j] (N/K_1) \times F_c$$

where:
   $F_o$ is the frequency of the output signal from the binary rate multiplier
   $K_1$ is a constant representing the scale factor size and is determined by the formula $K_1 = 2^R$ where R is the number of bit positions contained in the scale factor register
   N is the magnitude of the scale factor and
   $F_c$ is the frequency of the signal input to the binary rate multiplier.

13. The conversion system of claim 12 further comprising:
   gate means for transferring the contents of said counter internal register to said storage register means in response to reset pulses received from said reset logic means.

14. The conversion system of claim 13 further comprising inverter means intermediate said gate means and internal counter register for inverting the values of bits transferred to said storage register means.

15. The conversion system of claim 14 wherein the scale factor register is one bit larger than the storage register means, the least significant bit position of the scale factor register is permanently biased high and the remaining bits of the scale factor register are set by the storage register in the same order such that the most significant bit position of the storage register corresponds to the most significant bit position of the scale factor register.

16. The conversion system of claim 9 wherein said counter further comprises a carry output terminal for transmitting the overflow from said internal counter register.

17. The conversion system of claim 16 further comprising:
   overflow latch means connected to said carry output terminal for storing and transmitting an indication of carry overflow and including clear means to remove said indication in response to reset pulses from said reset logic means.

18. The conversion system of claim 16 further comprising:
   microprocessor means for receiving the contents of the internal counter register and the scale factor and using them and stored data representing the first clock frequency and the bit size of the scale factor register to compute the frequency of the AC signal.

19. The conversion system of claim 17 further comprising microprocessor means for terminating processing of the AC signal in response to signals received from said overflow latch means.

20. The conversion system of claim 15 further comprising logic means for generating reset pulses to reset the binary values stored in said storage register means to zero at the beginning of every second cycle of said AC signal.

* * * * *

UNITED STATES PATENT AND TRADEMARK OFFICE
CERTIFICATE OF CORRECTION

PATENT NO. : 4,107,600
DATED : August 15, 1978
INVENTOR(S) : William Thomas McMannis It is certified that error appears in the above-identified patent and that said Letters Patent are hereby corrected as shown below:

Column 8, line 35, "pulse" should read --pulses--;

Column 9, line 43, "enabled" should read --enable--;

Column 10, line 5, should read "$F_o = N/K_1 \times F_c$".

Signed and Sealed this

Twenty-fourth Day of April 1979

[SEAL]

Attest:

RUTH C. MASON
*Attesting Officer*

DONALD W. BANNER
*Commissioner of Patents and Trademarks*